Sept. 8, 1964 E. J. SPERBER ETAL 3,147,630

TUNING CONTROL MECHANISM

Filed March 5, 1962 2 Sheets-Sheet 1

INVENTORS
EDWARD J. SPERBER &
NORMAN G. KELLN

BY Eugene M. Whitacre
Attorney

Sept. 8, 1964 E. J. SPERBER ETAL 3,147,630

TUNING CONTROL MECHANISM

Filed March 5, 1962 2 Sheets-Sheet 2

INVENTORS
EDWARD J. SPERBER &
NORMAN G. KELLN

BY Eugene M. Whitacre
Attorney

United States Patent Office 3,147,630

Patented Sept. 8, 1964

3,147,630

TUNING CONTROL MECHANISM

Edward J. Sperber and Norman G. Kelln, Indianapolis, Ind., assignors to Radio Corporation of America, a corporation of Delaware Filed Mar. 5, 1962, Ser. No. 177,533

8 Claims. (Cl. 74—10.15)

The present invention relates to television receiver and like tuners of the rotary channel-selector type, and more particularly to remote tuning control mechanisms therefor.

Generally speaking, a television or like tuner, of the type to which the invention relates, includes a rotary tuning control element, such as a control shaft, movable progressively through a plurality of detent-controlled, angularly-spaced, channel-tuning or stop positions over a full 360° range of movement in either direction by manual control knob or like means connected therewith. Visual channel indicator means provides for stopping the tuning at the desired channel when making manual tuning adjustment of the receiver.

It is an object of this invention to provide an improved solenoid-operated remote tuning control mechanism, for television receivers and the like, which permits free manual tuning operation thereof and provides protection against shock and vibration normally inherent in the operation of solenoid magnet driver means.

It is also an object of this invention to provide an improved remote tuning control mechanism for television channel tuners and like step-operated rotary signal-selecting means which permits free rotation thereof in either direction manually without restraint by reason of the remote control function, and which provides effective damping against inherent hammer or shock action resulting from solenoid operation of said mechanism.

In accordance with one embodiment of the invention, a channel tuner or like step-operated rotary signal-selecting means for a television or other signal receiver, is detent-controlled in its various progressive tuning positions by suitable detent means, as is commonly used, having a resilient stop element which is displaced against spring tension as the tuner is adjusted from one stop position to the next. A solenoid-operated step mechanism is connected with the tuner or signal selecting means for rotating the control element thereof, such as a tuning shaft, in one direction through the medium of a ratchet wheel or ratchet attached thereto and driven by a ratchet pawl carried on a pawl arm which rotates on the same axis as the ratchet. A solenoid magnet having a reciprocating solenoid core or plunger is connected with the pawl arm to drive the ratchet wheel through the ratchet pawl carried by the arm, and thus advance the tuner or signal selecting means through its rotational steps or channel settings, each of which is established by the detent means.

The vibrational shock inherent in the operation of the solenoid plunger, which would normally be applied to the tuner through the shaft and ratchet driver elements, is damped or substantially absorbed by spring damping means interposed in the connection between the solenoid plunger and the driver element of the mechanism such as the ratchet wheel. Damping means properly interposed in the mechanical driving connection between the solenoid and the tuner is of importance, particularly in high-frequency apparatus such as television receivers and the like, where disturbance of the tuning adjustment for each of the several steps or channels would require frequent servicing and a reduction in the operating life of the tuner. Without such protection, high-frequency tuners of this type do not operate effectively while taking advantage of the low cost and simplified construction provided by the solenoid-operated driving mechanism.

Further, in accordance with the invention, the damping spring means may be included as part of the ratchet pawl arm or in connection with the solenoid plunger in carrying out the requirements for both low cost and simplified construction and, likewise, the means for releasing the solenoid driver to permit free rotation of the tuner shaft is attained by the use of a fixed stop element in the path of movement of pawl and in connection with an extension thereof as hereinafter will be described.

The invention, together with further features and advantages thereof, will further be understood from the following description of certain embodiments thereof, when considered in connection with the accompanying drawings, and its scope is pointed out in the appended claims.

Figure 1:
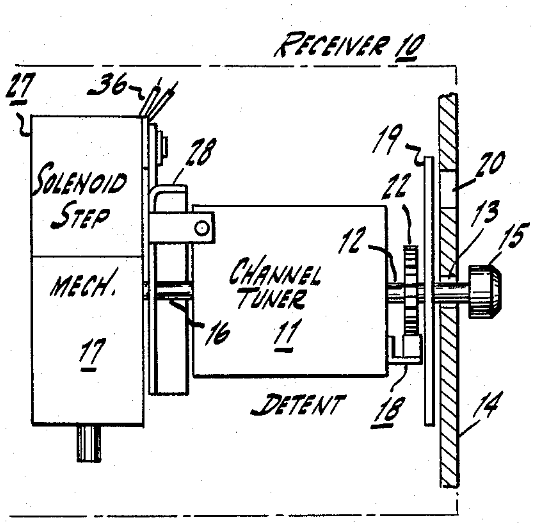
FIGURE 1 is a side view, in elevation, of a signal receiver having a channel tuner provided with a solenoid-operated remote tuning control mechanism embodying the invention.
Figure 2:
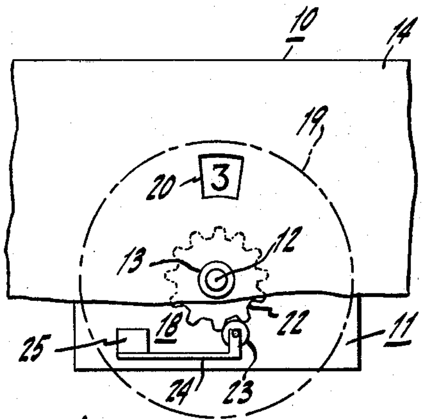
FIGURE 2 is a fragmentary frontal or end view of the receiver and tuner of FIGURE 1 showing certain details of construction thereof.

Referring to the drawings, wherein like elements throughout the various figures are designated by like reference numerals, and referring particularly to FIGURES 1 and 2, a receiver 10, such as a television signal receiver, is provided with a channel tuner 11 having a rotary control shaft 12 by which the tuner is adjusted to any one of a plurality of signal-selecting or channel-tuning positions in a 360° range of rotation. The shaft 12 extends through an opening 13 in the front control panel 14 of the receiver and is connected with a manual tuning control knob 15 by which the shaft 12 may be turned in either direction progressively from one channel tuning position to the next.

A rear extension 16 of the tuning control shaft 12 is connected with a solenoid step mechanism 17 which provides the remote control driving means for the shaft 12 when it is not being manually tuned by the control knob 15.

The tuning control shaft 12 is provided with detent means 18 which provides a plurality of controlled angularly-spaced channel tuning or stop positions to which the shaft may be moved for exact channel tuning by manual adjustment, or by remote control through the solenoid step mechanism 17. Visual indication means for positioning the tuning shaft manually is provided by a suitable dial element 19 mounted on the shaft 12 and rotatable therewith. This may be provided with channel marking indicia or numbers as indicated in FIGURE 2 for example, which are visible thereon through a window 20 in the panel front as the shaft 12 is turned to the various detent stop positions. An adjustment for Television Channel 3 is indicated.

The detent means may be in any suitable form having a resilient, spring-pressed detent element. In the present example, it comprises a usual star wheel 22, mounted on the shaft 12 to rotate therewith and providing spaced stop notches corresponding in number to the number of stops required for the tuner 11 and are similarly angularly spaced. The stop notches are engaged by the detent element which is a roller 23 carried on the free end of a spring arm 24. The opposite end of the arm is fixed, being provided with an integral foot or plate 25 secured to the tuner 11 as shown more clearly in FIGURE 2. As shaft 12 is turned either by the solenoid step mechanism 17 or the tuning knob 15, the resilient detent element or roller 23 is displaced against the force of the spring arm 24 which requires the application of a predetermined torque or rotational force to the shaft sufficient to dislodge the roller or stop element 23 from the detent or star wheel 22 as the shaft is turned in either direction. This force is used, as will hereinafter appear, in connection with an operational feature in the solenoid step mechanism. The tuner and tuning means with its detent elements are shown by way of example as representing a suitable rotary signal selecting means which is step operated and provided with detent means.

The solenoid step mechanism 17 is provided with a main frame 27 which is bolted or otherwise secured to a mounting bracket 28 provided in the receiver for supporting this mechanism and the channel tuner 11 in spaced aligned relationship as indicated in FIGURE 1. The mounting bracket 28, may be supported in the receiver casing in any suitable manner (not shown), and is adapted to provide a compact and rigid mounting means for the solenoid step mechanism in connection with the channel tuner. In this construction, the solenoid mechanism is thus connected with the rear extension 16 of the rotary tuning element or shaft 12 and in no way interferes with the normal operation of the tuner by any suitable frontal tuning means for manual operation.

Figure 3:
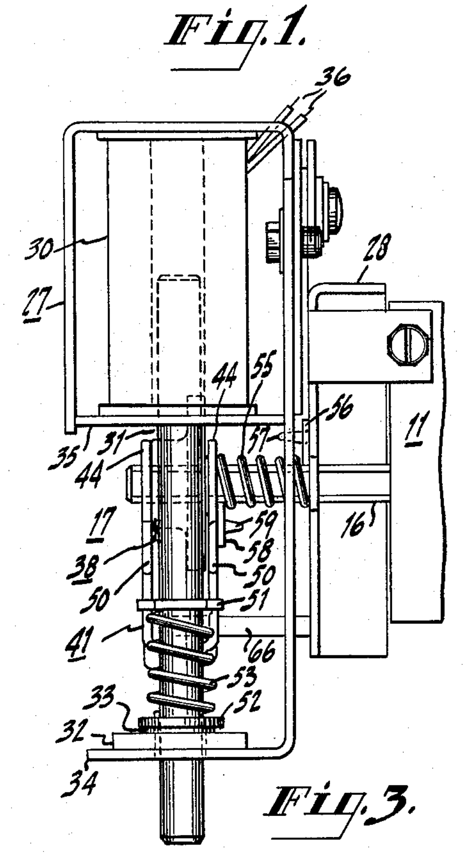
FIGURE 3 is a side view, on an enlarged scale, of the solenoid-operated remote tuning control mechanism of the receiver of FIGURE 1 showing further details thereof.

Referring now to FIGURES 3–6 inclusive, the tuning control mechanism and tuner relation therewith are shown in greater detail. It will be seen that the frame 27 of the mechanism is a flat plate bent at one end to form a housing area for a solenoid magnet winding or solenoid 30 as shown in FIGURE 3, surrounding a solenoid plunger or movable core element 31 therefor. The solenoid is mounted on a vertical axis, preferably as shown, so that the plunger normally may move by gravity to a retracted position from the solenoid, and in the drawing is shown in its lowermost or retracted position. The plunger is stopped by a resilient damping washer 32 which is engaged by a C-washer 33 or the like secured to the plunger near its lower end. The damping washer 32 is carried by a bracket portion 34 of the frame 27, which is substantially parallel with and spaced from the solenoid 30 and the portion of the bracket which encloses it. A plate 35 extending across the frame below the solenoid 30 serves to hold the latter in place in the frame and against longitudinal movement when energized to attract the plunger. The plate 35 and the bracket portion 34 are thus substantially parallel and both elements are provided with suitable openings for permitting free movement of the plunger therethrough, as is also the damping washer 32 which may be of any suitable resilient damping material for absorbing the force of the plunger in coming to rest in the retracted position shown.

The solenoid is energized by applying operating current to its input leads, indicated at 36, from any suitable remote control circuitry (not shown) or front panel touch bar tuning switch which does not concern the present invention. When energized, the plunger rises and moves to the opposite end of its travel or operating stroke, indicated by the dotted position 37 in FIGURE 4, for example. In moving from the position of rest to the energized or dotted position 37, the solenoid plunger serves to operate ratchet means for driving the tuner shaft, that is, the extension 16 thereof, through successive positions corresponding to the several channel tuning positions of the tuner 11 and which are established by the detent means 18.

Figure 4:
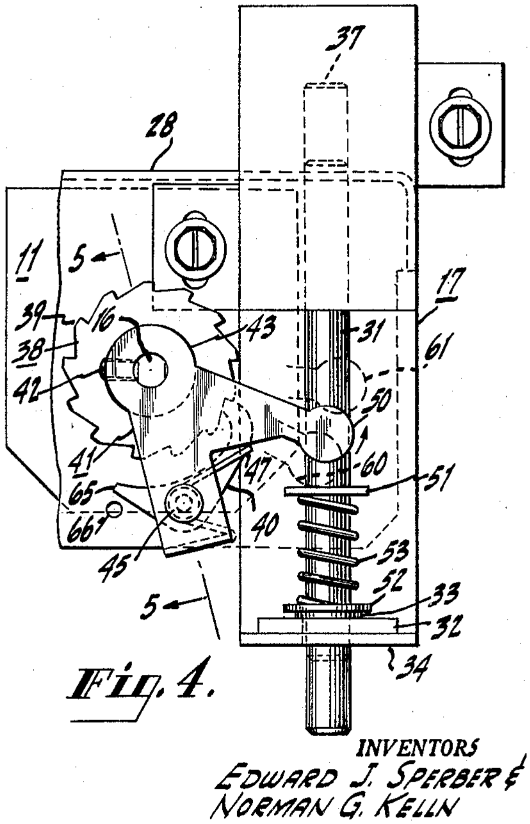
FIGURE 4 is a rear end view of the mechanism of FIGURE 3 further showing construction and operating details of the mechanism.

For this purpose, therefore, the shaft 16 is extended as indicated more clearly in FIGURE 3 and carries a ratchet wheel or ratchet 38 having a plurality of ratchet teeth 39 thereon, one for each angular position of the tuning shaft, as established by the detent means 18. The solenoid plunger 31 is connected with the ratchet 38, to drive it through a ratchet pawl 40 engaging the ratchet, as shown in FIGURE 4 for example, and a pawl arm 41 by which the ratchet pawl is pivotly carried, together with means providing a resilient damping spring connection between the solenoid plunger and the pawl arm.

Figure 5:
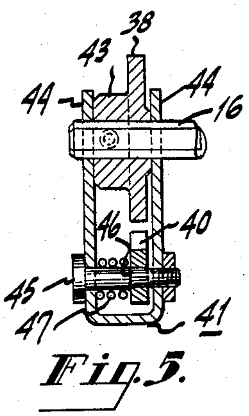
FIGURE 5 is a view, in cross section, of a portion of the mechanism of FIGURE 4, taken on the section line 5—5 of FIGURE 4.

The ratchet wheel or ratchet 38 is mounted on and securely connected to the tuning shaft 16 by any suitable means such as a set screw 42 which passes through a hub 43 of the ratchet 38 as indicated more clearly in FIGURE 5. The pawl arm 41 is mounted to rotate freely on the tuner shaft 16 and is U-shaped, with the tuner shaft 16 passing through the free ends thereof which are spaced to contact the ends of the ratchet 38 and to be held against longitudinal movement on the tuner shaft as more clearly indicated in FIGURE 5. For this purpose, the two side elements 44 of the pawl arm 41 are substantially parallel and spaced to provide slight clearance at each end of the ratchet 38, whereby the arm may rotate freely about the shaft 16 on the common axis with the ratchet 38.

The pawl 40 is pivotly mounted on the pawl arm, and between the two side elements thereof, in spaced relation to the shaft 16 on a pivot bolt 45. The pivot bolt passes through both sides 44 of the pawl arm and is provided with a shoulder 46 which holds the pawl 40 against one side of the arm in alignment with the teeth of the ratchet wheel 38, also as indicated more clearly in FIGURE 5. The pawl is held in engagement with the ratchet wheel by a coiled pawl spring 47 which is wrapped around the pivot bolt 45 and connected at one end with the pawl and at the opposite end with the pawl arm as shown in FIGURES 4 and 5. The biasing action of the spring is such as to drive the pawl normally into resilient latching engagement with the ratchet teeth in the manner indicated in FIGURE 4.

The pawl arm 41 is provided with lever means providing a connecting element with movable plunger 31. The lever means in the present example is effectively a side extension from the pawl arm, and since the pawl arm is U-shaped, it is provided with two lever elements 50 which extend from the spaced parallel side elements 44 on opposide sides of the plunger 31 from the pawl arm 41, in a position to be engaged and driven by a driving element carried by the plunger. In the present example, the driving element is a metallic ring or buffer washer 51 surrounding the plunger and maintained in space relation to a second metallic ring or buffer washer 52 which seats against the fixed or locked C-washer 33 below it on the plunger.

Between the washers is provided a helical compression spring 53 surrounding the plunger 31 and, with the washers 51 and 52, being free to move longitudinally on the plunger. The lever elements 50 are caused to bear against the driving ring or washer 51 by a coiled pawl-arm return spring 55 surrounding the tuning shaft extension 16 between the mounting bracket 28 and the pawl arm 41. The one end 56 of the pawl-arm return spring is connected with and held against rotation by a lance or stop element 57 connected with the frame 28. The opposite end of the pawl-arm return spring engages and is held by a similar lance or stop element 59 carried by the pawl arm 41, that is, by the right side element 44 thereof, as shown in FIGURE 3. The return spring 55 is placed under rotational tension and permitted to expand or uncoil against the stop elements 57 and 59.

With the stop element 57 fixed by the mounting bracket 28, the stop element 59 and the pawl arm 41 are thereby moved in a direction to bring the lever elements 50 into firm engagement with the driving ring 51. This position is indicated in FIGURE 4 by the dotted outline 60 and will further be described. The lever elements 50 are in their rising position, as would be the case when driven by the element 51 upwardly in the direction of the arrow, the extreme limit of travel being indicated by the upper dotted outline 61 in FIGURE 4 and corresponds to the uppermost limit of the plunger travel as indicated by the dotted lines 37.

The C-washer 33, being fixed to the plunger, operates as a stop element or abutment on the plunger to stop on the damping washer 32, which is firmely held by the bracket element 34 of the solenoid frame. The damping washer absorbs the downward hammer action of the plunger in coming to rest in the retracted position, and thus prevents noise and the transmission of shock and vibration to the tuner from this source.

The two damping spring washers or buffer rings 51 and 52 at opposite ends of the damping spring 53 are free to move on the plunger to permit the spring to be compressed during operation of the mechanism as will hereinafter appear.

Figure 6:
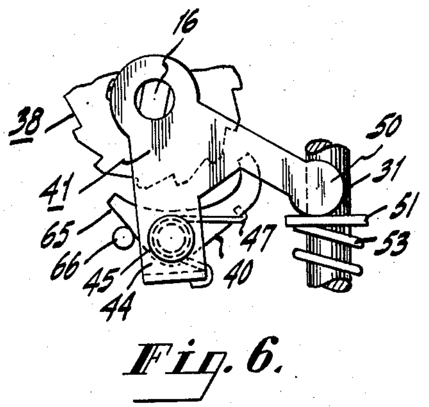
FIGURE 6 is a fragmentary view of a portion of the mechanism of FIGURES 3 and 4, showing still further details of construction and operation thereof.

Referring more particularly to FIGURE 6 along with FIGURE 4, the pawl arm 41 is here shown in its fully lowered position in contact with the ring or washer 51 and with the ratchet pawl 40 disengaged from the ratchet wheel or ratchet 38. The ratchet pawl is provided with a rear extension or retracting lever 65 which, at the limit of travel of the pawl arm 41 as shown in FIGURE 6, strikes and moves against a fixed stud or stop pin 66 connected rigidly to a fixed portion of the mechanism such as the frame 28, being staked thereto as indicated in FIGURE 3. This causes the ratchet pawl 40 to pivot about the axis provided by the pivot bolt 45, against the biasing force of the pawl spring 47, due to the greater force of the pawl-arm return spring 55 which is tensioned sufficiently to overcome the force of the spring 47, thereby forcing the pawl arm 41 into fully retracted position, indicated at 60 in FIGURE 4 and shown in FIGURE 6, against the ring 51 when the plunger 31 is in the lowermost or inactive position shown.

When the solenoid is energized, the damping spring 53 is compressed due to the resistance applied to the pawl arm through the ratchet pawl from the ratchet wheel and the tuner shaft in overcoming the detent torque or holding force of the detent means 18 on the forward end of the tuning shaft. The plunger causes the tuner to be advanced one step or from one channel position to the next in completing its upward stroke, but the initial abrupt plunger action or movement which inherently tends to produce hammer or shock action on the tuner connected therewith is substantially absorbed by the damping spring action in compression as the C-washer 33 drives the lower buffer washer or ring 52 and spring upwardly against the then substantially fixed upper buffer or washer ring 51. Further compression then causes the detent to be dislodged and the tuner then turns on the further upward movement of the plunger.

By this means a resilient damping spring connection is provided between the solenoid plunger and the pawl arm and thus prevents the abrupt shock action of the solenoid from being transmitted to the tuner shaft and the tuner. When the solenoid is denergized, the plunger falls until it is stopped by the buffer washer 32, and is followed and assisted in this return movement by the pawl arm under the biasing force of the return spring 55. The fixed stud or stop element 66 meets the rear extension or lever element 65 of the pawl at the end of the operating movement of the arm and the plunger, and pivotally moves the pawl from engagement with and clear of the ratchet. This releases the ratchet and thereby the tuner shaft from its connection with the solenoid step mechanism. The tuner may then be operated manually by the tuning knob 15, since the shaft is free to turn in either direction without restraint by reason of the remote control function. The tuning control mechanism of the present invention thus provides for free manual tuning operation, and protection against shock and vibration normally inherent in the operation of solenoid-magnet driver means. With this improved construction, high-frequency sensitive tuning means of the type shown and described may be operated by a simplified, low cost mechanism of the solenoid magnet type over long periods of time without extensive repair or adjustment.

Figure 7:
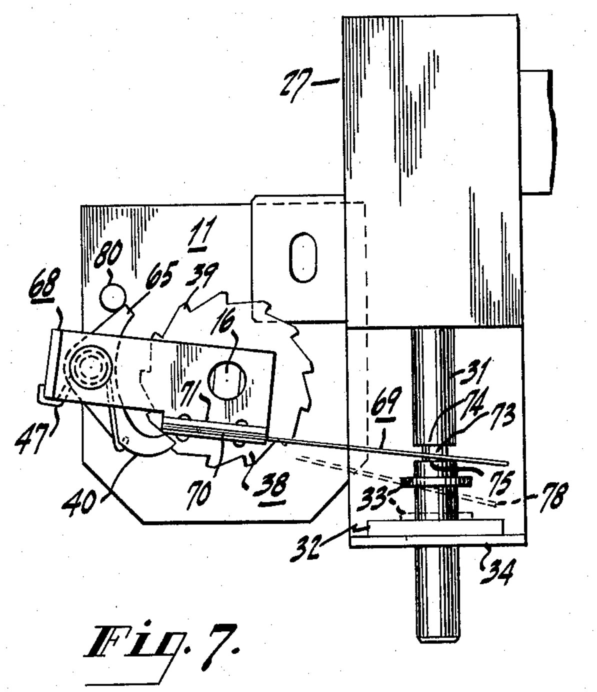
FIGURE 7 is a rear end view of the operating mechanism corresponding to FIGURE 4, showing a modification thereof in accordance with the invention, and, FIGURE 8 is a fragmentary top view of the modified mechanism of FIGURE 7 showing further details of the construction and operation thereof.
Figure 8:
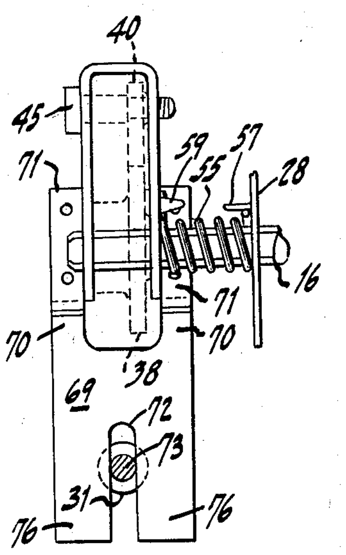

In the construction shown in FIGURES 3–6 inclusive, the pawl arm is provided with substantially rigid lever extension elements 50, and the solenoid damping action is provided by the compression-type coiled damping spring element 53 surrounding the plunger between the buffer rings 51 or 52. The damping spring element thus effectively provides a resilient driving connection between the solenoid plunger and the tuner shaft, or between the solenoid plunger and the pawl arm, in driving the tuner. This resilient driving connection may be provided by a modification of the pawl arm as shown in FIGURES 7 and 8, to which attention is directed along with the preceding figures. In this modification, the tuner and the solenoid and plunger construction, and their physical and operative relationship are the same. The same pawl 40 is carried by a U-shaped modified pawl arm 68 which pivots about the shaft 16 at its ends to carry the pawl into engagement with the ratchet 38 as in the preceding example. The ratchet is secured to the shaft as before, and both the ratchet pawl and ratchet are mounted between the two parallel side elements of the pawl arm as in the preceding example.

In the present modification, the lever extension of the pawl arm is provided by means of an elongated flexible flat plate or spring 69 which is slotted or divided at each end. At the pawl arm end, two branches 70, on opposite sides of the ratchet, are riveted or otherwise secured to side wings or flanges 71 extending laterally from the pawl arm on each side. At the free end, an elongated slot 72 is provided to receive a reduced central section 73 of the plunger 31 which provides upper and lower driver shoulders 74 and 75 for meeting the two branches or fingers 76 of the spring about the slot, as the plunger moves into and out the solenoid. A dotted portion of the spring is shown at 78 to indicate the rest position therefor. The fixed C-washer 33 on the plunger meets and stops against the damping washer 32, as indicated by the dotted outline, to stop the plunger in the rest position.

In this modification, the lever extension 65 of the ratchet pawl 40 strikes and moves against a suitably positioned fixed stop or stud element 80 to release the connection between the solenoid step mechanism and the tuner shaft as in the preceding example, when the solenoid plunger 31 is at rest and withdrawn from the solenoid.

Also in this modification, as the plunger moves upwardly, the driving shoulder 75 meets the spring finger elements 76, applying a bending action to the spring 69 and thus absorbing the shock of the plunger action until the holding force of the detent means is overcome. Thus, the action is similar to that as in the preceding example except that a further simplified and lower cost construction is provided. It will be seen that in this modification the pawl arm is effectively moved substantially 90 degrees or more from its former position, as viewed in the drawing, and the pawl arm lever extension is replaced by spring lever extension means, so that the pawl arm connection per se provides the resilient damping spring connection between the solenoid plunger and the pawl arm. The actuating spring 47 for the pawl is arranged in the same manner and the pawl stop 80 operates the same as in the preceding modification to bring the solenoid step mechanism into an inactive position following its operation to move the tuner.

From the foregoing description it will be seen that the advantages of solenoid-operated remote control mechanisms, which are faster in operation and less costly than other motor-operated mechanisms of this type, may be fully realized in connection with television tuners and similar high-frequency sensitive tuning devices in accordance with the invention, without the disadvantages normally associated with the operation of such mechanisms, and the tuning elements thereof are free to move under manual control without restraint or other impediment by reason of the added remote control function.

What is claimed is:

1. In a television receiver or the like, the combination with a channel tuner having a rotatable control shaft with a plurality of detent-controlled angular stop positions and manual tuning control means, of a remote control mechanism for operating said tuner, said mechanism being of the solenoid-magnet type having a solenoid plunger and a ratchet and pawl, means for mounting said ratchet and pawl on said rotatable control shaft so that energization of said solenoid-magnet causes said plunger to operate said ratchet and pawl to drive said rotary control shaft from one of said plurality of detent stop positions to the next, a resilient damping element connected between said plunger and ratchet-and-pawl means and operating against the detent torque of the tuner for reducing shock effect of the solenoid driver operation on said tuner, said pawl being positioned clear of said ratchet except during energization of said solenoid-magnet.

2. The combination with a signal receiver tuner of the rotary channel-selector type having a rotatable control shaft with a plurality of detent-controlled angular stop positions and manual control means for operating said tuner, of solenoid magnet means having a reciprocating plunger element, a ratchet wheel mounted on control shaft, means coupling said plunger element to said ratchet wheel when said solenoid-magnet means is energized to rotate said rotatable control shaft from one angular stop position to the next, spring damping means for reducing shock effects in the solenoid operation on said tuner, and means for releasing the tuner for free manual operation in response to return movement of said plunger elements to said rest position.

3. The combination with a signal receiver tuner of the rotary channel-selector type having a rotatable control shaft with a plurality of detent-controlled angular stop positions and manual control means for operating said tuner, of a remote control mechanism for operating said tuner, said remote control mechanism being of the solenoid-magnet type having a reciprocating plunger element and ratchet-and-pawl means connected therewith, means for mounting said ratchet on said control shaft, spring damping means in the connection to said control shaft from said remote control mechanism to operate against detent torque at said stop positions for reducing the shock effect of the plunger operation on said tuner, and means for actuating said ratchet-and-pawl means to release the tuner for free manual operation at the end of each remote tuning operation with said plunger element at rest.

4. A solenoid-operated tuning control mechanism for television and like tuners of the rotary channel-selector type, comprising in combination, a rotatable tuner operating shaft, a ratchet carried by and secured to said shaft, a pawl arm mounted on said shaft for rotational operating movement thereon, a pawl pivotally mounted on said arm and engaging said ratchet to drive said shaft in response to operating movement of said arm, detent means for applying torque to said shaft to resist turning movement at predetermined angular channel tuning positions thereof, a solenoid magnet having a reciprocating plunger element movable from a rest position through an operating stroke in response to energization and connected with said pawl arm to drive said shaft through the ratchet and pawl means, a spring damping element in the driving connection between the plunger element and said pawl arm operable against the detent torque at said angular tuning positions for reducing shock effects inherent in the operation of said solenoid plunger element, and means responsive to movement of the pawl arm with the plunger element to the rest position for actuating said pawl to release the ratchet and shaft for manual tuning operation.

5. A tuning control mechanism as defined in claim 4, wherein the spring damping element is a helical coiled spring surrounding said plunger element and provided with end buffer ring elements, one of which engages a lever extension of the pawl arm to compress the spring in response to said operating stroke of the plunger element from the rest position, and wherein the means responsive to movement of the pawl arm with the plunger element to the rest position for actuating said pawl to release the ratchet and shaft for manual tuning operation includes a rear extension element on said pawl and a fixed stop element for meeting said rear extension element and pivotally moving said pawl from engagement with and clear of the ratchet.

6. A solenoid-operated tuning control mechanism for television and the like tuners of the rotary channel-selector type, comprising in combination, a rotatable tuner operating shaft a ratchet wheel carried by and secured to said shaft, a pawl arm rotatable on said shaft and having flexible extension lever means for resiliently imparting operating movement thereto, a pawl pivotally mounted on said arm and engaging said ratchet wheel to drive said shaft in one direction in response to operating movement of said arm, detent means for applying torque to said shaft to resist turning movement at predetermined angular channel positions thereof, a solenoid magnet having a reciprocating plunger element movable from a rest position through an operating stroke in response to energization and connected with the flexible extension lever means of said pawl arm, said lever means thereby providing a damping element in the shaft driving connection operable against the detent torque for reducing shock effects inherent in the operation of said solenoid plunger element, and means responsive to return movement of the plunger element to the rest position for releasing said shaft for free manual turning operation from one angular position to another.

7. A solenoid-operated remote tuning control mechanism for television and the like tuners of the rotary channel-selector type, comprising in combination, a rotatable tuner operating shaft, a ratchet wheel carried by and secured to said shaft, a U-shaped pawl arm rotatable at its ends on said shaft and having spaced side elements embracing the ratchet wheel on each side thereof for preventing longitudinal movement on said shaft, a pawl pivotally mounted on said arm between said side elements and resiliently engaging said ratchet wheel to drive the shaft in one direction in response to operating movement of said arm, detent means for applying torque to said shaft to resist turning movement at predetermined angular tuning positions thereof, a solenoid magnet having a reciprocating plunger movable from a rest position through an operating stroke in response to energization, means connecting the plunger with the pawl arm for imparting said operating movement thereto in response to movement of said plunger from said rest position through said operating stroke, said last named means including a spring damping element operable against the detent torque for reducing shock effects inherent in the operation of said solenoid plunger, spring biasing means connected with the pawl arm to move the plunger with the arm to said rest position, and means including a fixed stop pin in the path of its movement with said arm for retracting said pawl from the ratchet wheel in response to movement of the plunger to said rest position, thereby to permit manual turning operation of said shaft from one angular tuning position to another without restraint or impediment by reason of the remote control function.

8. The combination with a television channel tuner, of a tuning control mechanism therefor, comprising a rotatable tuning shaft, a ratchet carried by and secured to said shaft, a pawl arm mounted on said shaft for rotational operating movement thereon, a pawl pivotally mounted on said arm and engaging said ratchet to drive said shaft in one direction in response to operating movement of said arm, detent means for applying torque to said shaft to resist turning movement at predetermined angular channel tuning positions thereof, a solenoid magnet having a reciprocating plunger element movable from a rest position through an operating stroke in response to energization and connected with said pawl arm to impart said operating movement thereto from a corresponding position of rest, a spring damping element in the driving connection between said arm and said plunger element operable against the detent torque for reducing shock effects inherent in the operation of said plunger element, and means responsive to return movement of the pawl arm with the plunger element to the rest position for releasing said shaft for free manual turning operation from one angular position to another, said last named means including a fixed stop element in the path of movement of the pawl with the arm to said position of rest to pivotally move said pawl from engagement with and clear of the ratchet.

References Cited in the file of this patent

UNITED STATES PATENTS

| | | |
|---|---|---|
| 713,497 | Rowland | Nov. 11, 1902 |
| 2,342,851 | Fichter et al. | Feb. 29, 1944 |